US005684726A

United States Patent [19]
Osborn et al.

[11] Patent Number: 5,684,726
[45] Date of Patent: Nov. 4, 1997

[54] FIRING METHOD & APPARATUS FOR RANDOM ESD TESTING

[75] Inventors: Brock Estel Osborn, Hyde Park; Chang-yu Wu, Wappingers Falls; Howard Herbert Nick, Lagrangeville, all of N.Y.

[73] Assignee: International Business Machines Corporation, Armonk, N.Y.

[21] Appl. No.: 669,203

[22] Filed: Jun. 24, 1996

[51] Int. Cl.⁶ ............................................. H01T 19/00
[52] U.S. Cl. ..................... 364/579; 364/580; 364/481; 371/27; 395/183.01; 395/183.22
[58] Field of Search ............................. 364/579, 580, 364/554, 551.1, 550, 552, 481; 361/230, 212, 231–232; 324/158 R, 73 R, 117 R, 130, 158.1; 379/29, 6, 10, 28, 90; 395/183.14, 1, 83.21, 22, 500; 371/20.4, 27, 20.1, 21.1, 22.6

[56] References Cited

U.S. PATENT DOCUMENTS

| | | | |
|---|---|---|---|
| 4,935,839 | 6/1990 | Lockwood | 361/230 |
| 4,961,157 | 10/1990 | Nick et al. | 364/579 |
| 5,116,767 | 5/1992 | DeChiaro | 437/7 |
| 5,132,612 | 7/1992 | Burns | 324/158 F |
| 5,166,624 | 11/1992 | Abernathy | 324/452 |
| 5,410,254 | 4/1995 | Consiglio | 324/456 |
| 5,477,460 | 12/1995 | Vakirtzis et al. | 364/489 |
| 5,510,705 | 4/1996 | Langrish | 324/158.1 |
| 5,530,612 | 6/1996 | Maloney | 361/56 |

OTHER PUBLICATIONS

C.L.Liu, "Introduction to Combinatorial Mathematics" By McGraw-Hill Book Company p. 7, 1968.

Calcavecchio, R.J. et al., "A Standard Test to Determine the Susceptibility of a Machine to Electrostatic Discharge", IEEE Conference 1986, pp. 475–482.

Primary Examiner—Emanuel T. Voeltz
Assistant Examiner—Cuong Nguyen
Attorney, Agent, or Firm—Lynn L. Augspurger

[57] ABSTRACT

The present invention employs random electrostatic discharges to stress test electrical machinery, particularly digital computer systems running repetitive diagnostic programs. There is provided an interactive capability which allows the user to determine test duration either in terms of a fixed time or in terms of a specified confidence level, the latter case being one in which the system provides the user with an indication of the run time required. Significant improvements over deterministic "zapping" devices result. The improvement includes solving the equation:

$$P = \left[ \sum_{i=0}^{G} \binom{G}{i} \left( \frac{G-i}{G} \right)^{\frac{d}{q}} (-1)^i \right]^q \quad (B)$$

(Where:

$$G = \frac{A \times \text{program length}}{\text{element size} \times q} )$$

as a program step.

9 Claims, 4 Drawing Sheets

TEST DURATION CONTROL (CON'T)

TEST DURATION CONTROL

TEST DURATION CONTROL (CON'T)

RANDOM FIRE
TIMING CONTROL

FIRING METHOD & APPARATUS FOR RANDOM ESD TESTING

FIELD OF THE INVENTION

This invention is related to a method and apparatus for Electrostatic Discharge (ESD) Testing, and particularly to the control of firing or discharge pulse timing through computer control.

GLOSSARY OF TERMS

While dictionary meanings are also implied by certain terms used here, the following glossary of some terms may be useful.

ESD ESD refers to Electrostatic Discharge, used in testing of electronic devices.

BACKGROUND OF THE INVENTION

U.S. Pat. No. 4,961,157 (assigned to International Business Machines Corporation, the assignee of the current application) describes a method for improving Electrostatic Discharge (ESD) testing by randomly timing the discharge pulses through computer control. This patent further describes a method for determining when testing is completed by introducing a formula which relates test time with confidence of complete test coverage. The procedure and formula presented assumes that the random discharges follow a uniform distribution on the interval (A,B) where A is the minimum firing time and B is the program length plus the minimum firing time.

This procedure is not ideal because the random interval increases with the length of the program, requiring an excessive amount of time for testing. To overcome this problem, the patent suggests that the interval (A,C) be used where A is as defined above and C is the smaller of B (defined above) and twice the minimum firing time. While the patented method does provide an improved formulation which reduces the amount of time for testing, we have found the time consumed is still greater than desired and have improved on this time.

Both the present invention and our prior work generally relates to electrostatic testing of electronic machines, particularly stored program digital computers. More particularly, our work is directed to an apparatus and method for randomly generating electrostatic discharge test patterns of appropriate duration and timing to insure a specified level of confidence in the test result.

Because of the characteristics of devices employed in present day electronic circuitry, complex electrical systems are sensitive to the occurrence of electrostatic discharges, such as occur when an improperly grounded person comes in physical contact with a machine. The electrostatic discharge that can result is capable of introducing errors and faults in machines such as digital computers. In order to insure that such machines are free from excess sensitivity to electrostatic effects, machines are tested prior to shipment. In these tests, machines are stressed as much as possible using conventional electrostatic discharge devices. These devices, which are typically controllable with respect to voltage, discharge rate and test duration nonetheless are constrained to operate in wholly deterministic ways.

The main problem associated with deterministic electrostatic testing arises out of the fact that the machine under test is executing a stored test program which includes a plurality of individual diagnostic steps. In the ideal case, it is desirable to "zap" the machine during execution of each one of these steps to insure that induced hardware errors are handled correctly. To this end the diagnostic program steps include error trapping mechanisms in each of the steps to indicate the presence of a particular hardware error. However, the discharge test device and the machine itself are not set in synchronization with one another since static discharges in the field are themselves random events. Furthermore, attempts at synchronization are difficult because of different lengths of test programs and because of the varying number and kinds of program steps with which they are involved. Currently, electrostatic discharge equipment is used to inject noise into operating data processing devices, usually in conjunction with diagnostic test routines. During these tests it is important to assure maximal diagnostic coverage in a minimal time. Maximal coverage means that a discharge occurs during each diagnostic step. However, because of the situation described above, many hours can be wasted both in computer time and in manpower if a well formulated test termination criterion is not implemented. In fact, without the introduction of randomness in testing, as proposed herein, it may not even be possible to insure total test program coverage.

In order to further clarify the test situation being considered herein, it can be assumed that a diagnostic test program which is repetitive in nature is running on a piece of data processing equipment under test. The test program particularly exercises the system error trapping mechanisms. The total length of run time which includes a number of iterations of the test program is referred to herein as the "experiment". In an asynchronous manner, an electrostatic discharge device (ESD)produces electrostatic discharges into the system in which the sequence of instructions is executing. It is a test objective to insure, with a certain level of confidence, that each portion of the repeating instruction sequence is executed simultaneously with an electrostatic discharge, at least once, in a minimal amount of time.

There are a number of reasons to require such tests. There is a significant need to test computer equipment prior to shipment for susceptibility to noise since the environments in which these machines are placed are subjected to a number of different noise sources. In particular, large scale computer installations often contain many computers together with associated input and output equipment. There are numerous non-ideal environmental situations which reside in customer installations that greatly affect the high availability of large systems. Some of these situations are customer power buses that serve as a common bus not only to one or more computers but also to other equipment as well. These buses generate noise which can enter computer systems. Additonally, miles and miles of under-the-floor cabling, oftentimes in neat long rows carry undesired cross talk noise to the computer circuits. Telephone lines and teleprocessing equipment cables can also couple noise into computer systems. The equipment which is often used by customers to guarantee uninterrupted power, as well as other motors, generators and diesel engines used in operating environments, also generates a high frequency noise spectrum. In general, noise may be radiated or conducted into a computer system. System operation in itself generates noise which can affect both the generating system and power or utility lines to which they are coupled. Indeed, the very grounding of systems can in fact have an effect on computer performance. It is thus seen that susceptibility to noise is a significant factor in the reliability, availability and serviceability of computer equipment. Accordingly, the desire for appropriate electrostatic testing is very important.

Accordingly, also, our improvements over our prior work has been to determine a method for performing these tests in a minimal amount of time without sacrificing test thoroughness.

SUMMARY OF THE INVENTION

This disclosure describes an improvement to U.S. Pat. No. 4,961,157. by providing a new solution which allows a user to test more effectively, thereby lowering cost and improving productivity during system test and manufacturing.

As in our prior work, in accordance with a preferred embodiment of the present invention, an aparatus for conducting an electrostatic discharge test of an electronic machine which repetitively executes a stored program comprises a test controller for controlling the discharge test and an electrostatic discharge means which is responsive to control by the controller. The discharge means operates to supply electrostatic discharges to the machine under test. More particularly, the test controller includes random fire timing control means for controlling time intervals between the electrostatic discharges such that the time intervals are random. Furthermore, the test controller includes test duration control means for controlling the duration of the electrostatic discharge test. Even more particularly, like our prior work, the present invention preferably provides an interactive environment in which a user (that is, an electrostatic discharge test technician) is able to interactively specify either a test duration or a probability that at least one electrostatic discharge occurs during each program step of a repeating diagnostic routine. The user is also able to specify a proportion of program steps that are to be "hit".

In preferred embodiments of the present invention, when the user specifies a desired probability (confidence level), the user is also provided with an indication of the number of test iterations (the test duration) that will be required before a desired confidence level is reached. Furthermore, if the user specifies a test duration, say in seconds, then the apparatus of the present invention preferably provides an indication of the probability of successful discharge coverage for the specified test duration. Additionally, the user may provide an indicated proportion of the number of program steps to be covered by the discharge test.

A preferred embodiment of the present invention also encompasses an improved method with a new formula for conducting an electrostatic discharge test of a machine, which repetitively executes a stored routine having a plurality of program steps, by means of electrostatically exciting the machine at randomly spaced time intervals and for a duration determined interactively through user specified parameters of run time duration, program proportion and/or confidence level.

Accordingly, it is an object of the present invention to reduce test durations associated with electrostatically stressing digital computer systems, and our new improvement uses the formula for estimating the probability of complete test coverage when the interval (A,C) is used to determine the random timing between discharges as we set forth in our detailed description which follows allowing not only use of our invention to increase the coverage of individual program steps with respect to the simultaneous or near simultaneous occurrence of disruptive electrostatic test discharges, but also permits a use for better enabling a user or tester to interactively specify a test duration and to ascertain a confidence level or probability associated with a selected test duration.

These and other improvements are set forth in the following detailed description. For a better understanding of the invention with advantages and features, refer to the description and to the drawings.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

Figure 1:
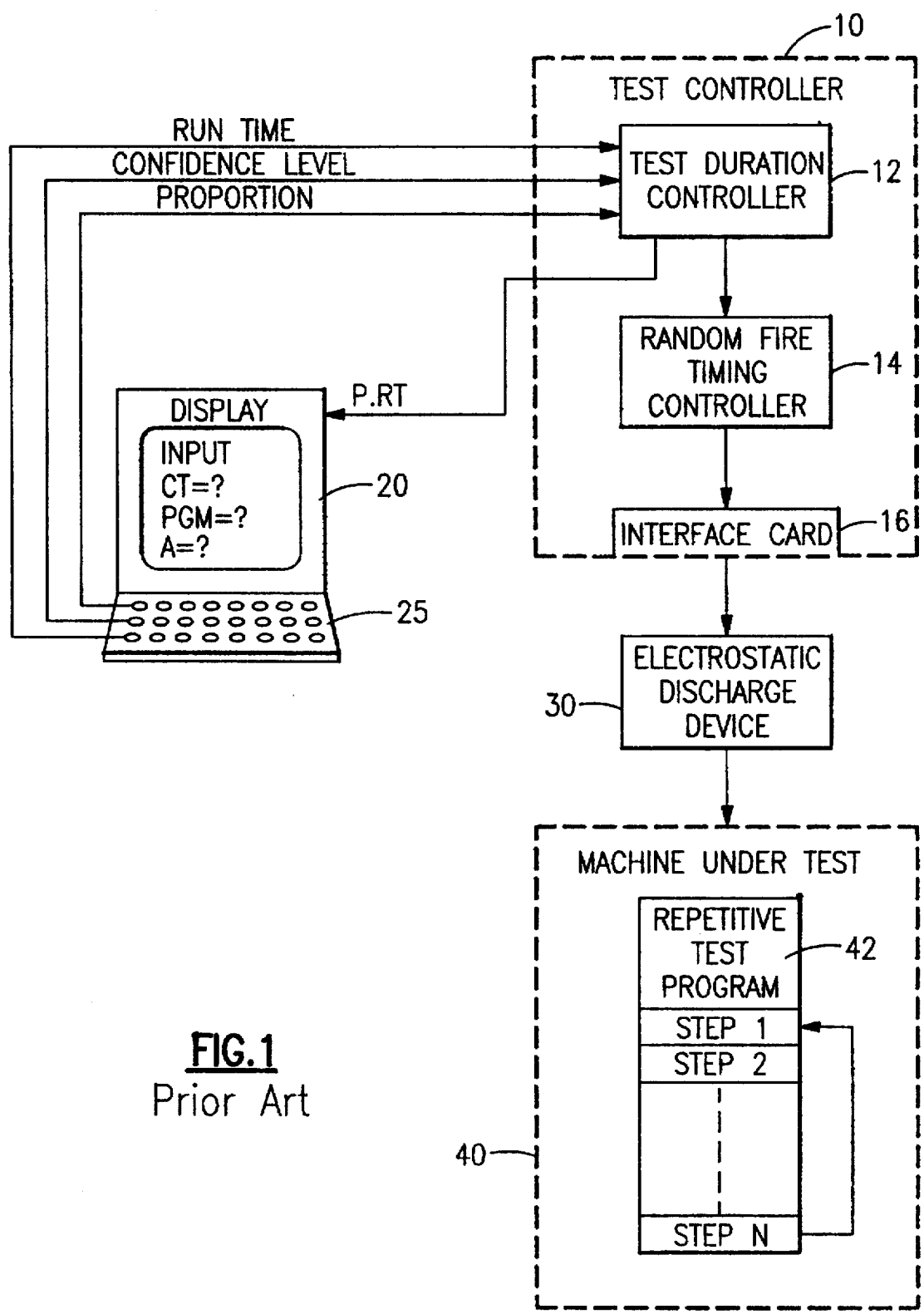
FIG. 1 is a schematic block diagram illustrating a preferred embodiment of the present invention which coincides with that of prior U.S. Pat. No. 4,961,157.
Figure 2A:
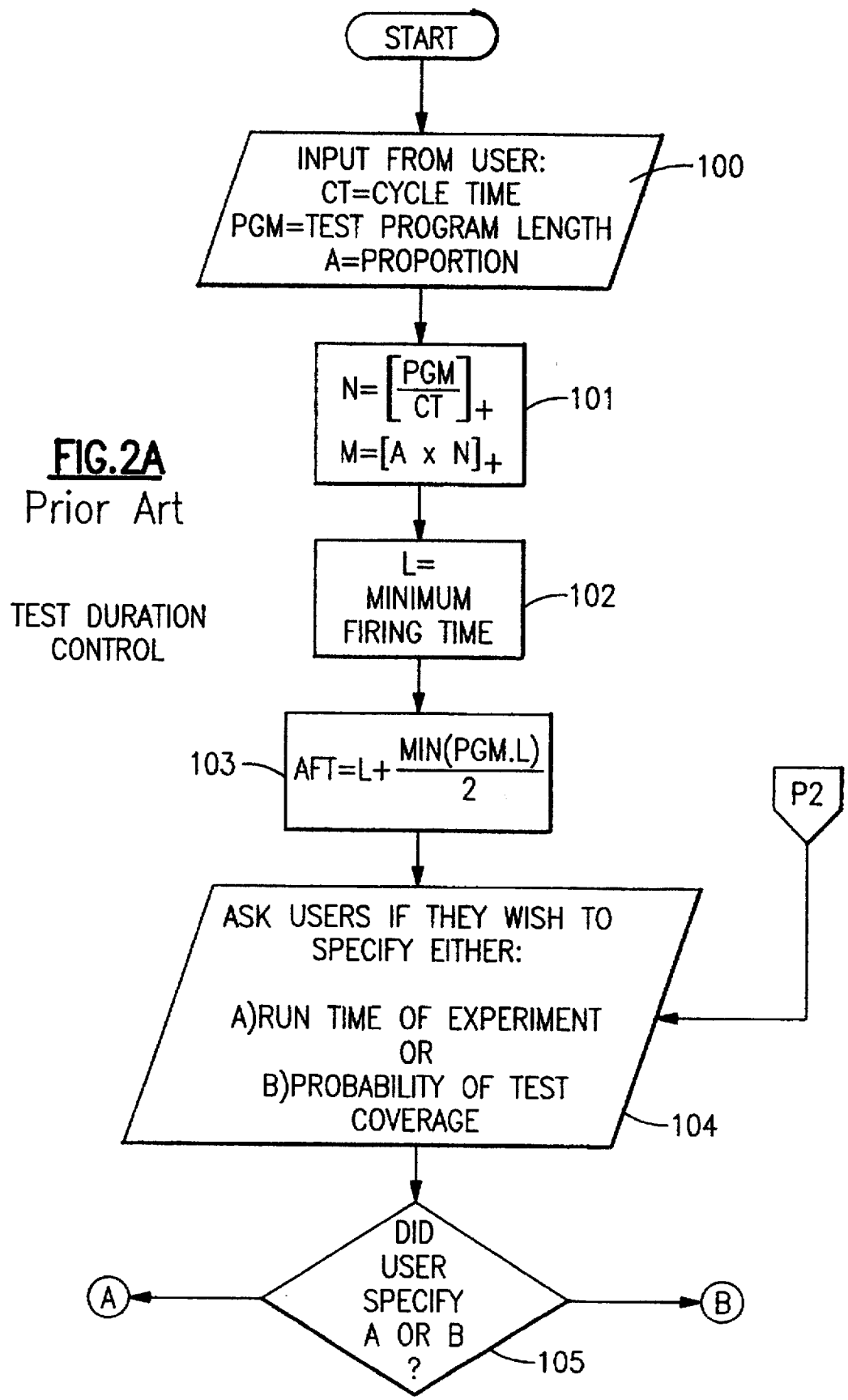
FIGS. 2A, and 2B are flowcharts illustrating a preferred method of test duration control; from which it will be seen that our new process improvement occurs in FIG. 2B at steps 112 and 121.
Figure 2B:
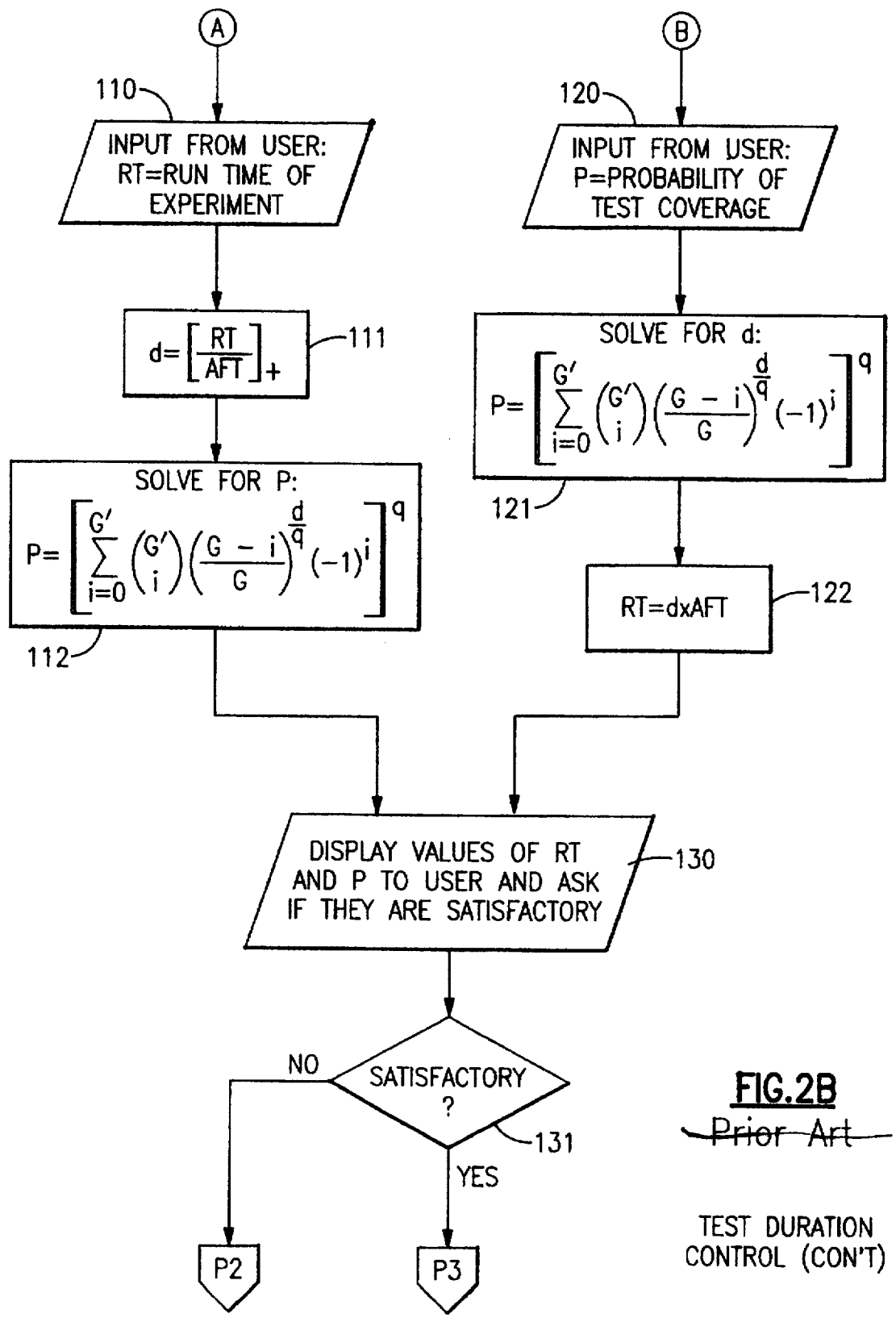
Figure 2C:
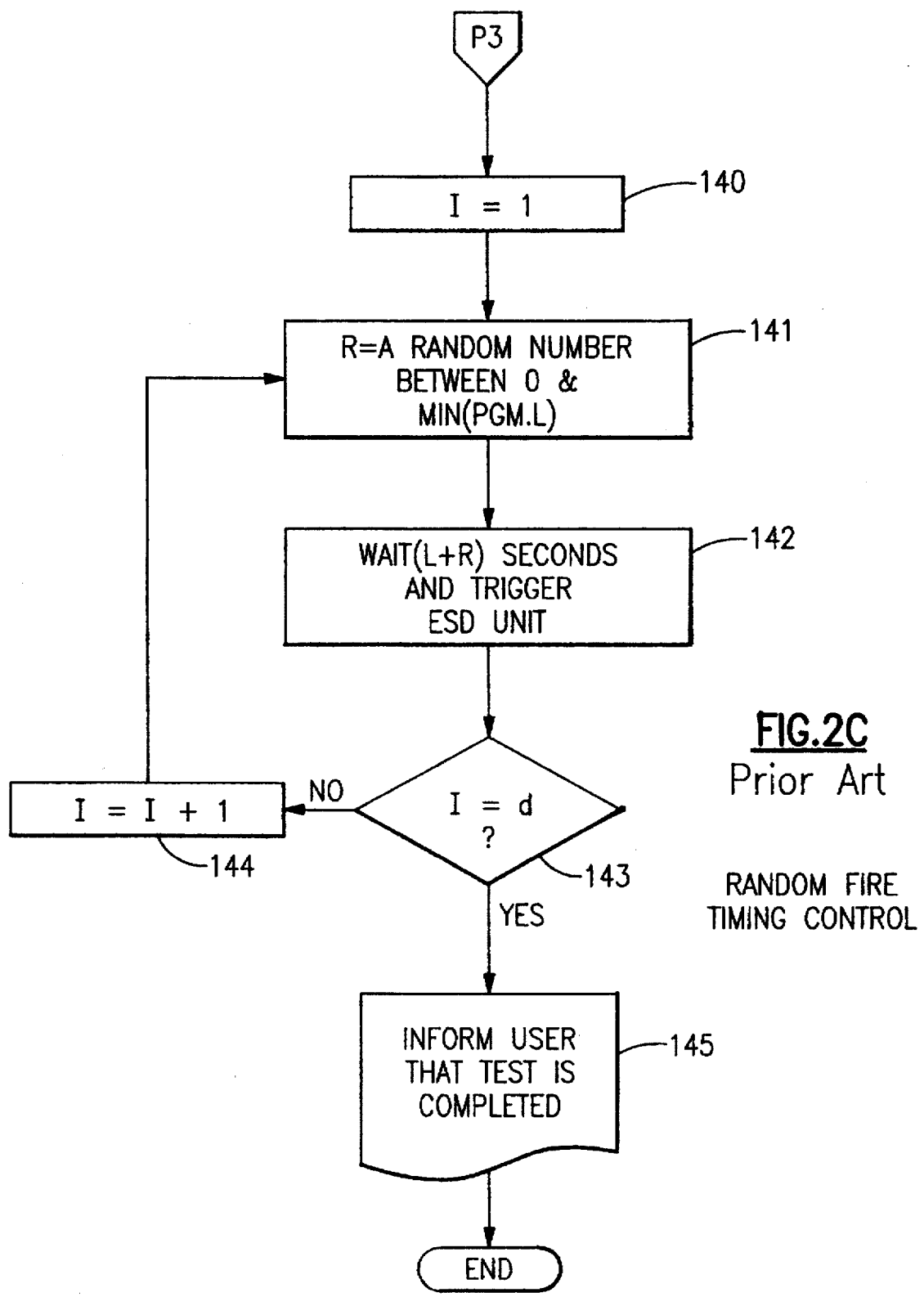
FIG. 2C is a flow diagram illustrating a preferred method for random fire timing control in accordance with preferred embodiments of the present invention when our new method continues as in our prior work.
Figure 2B:
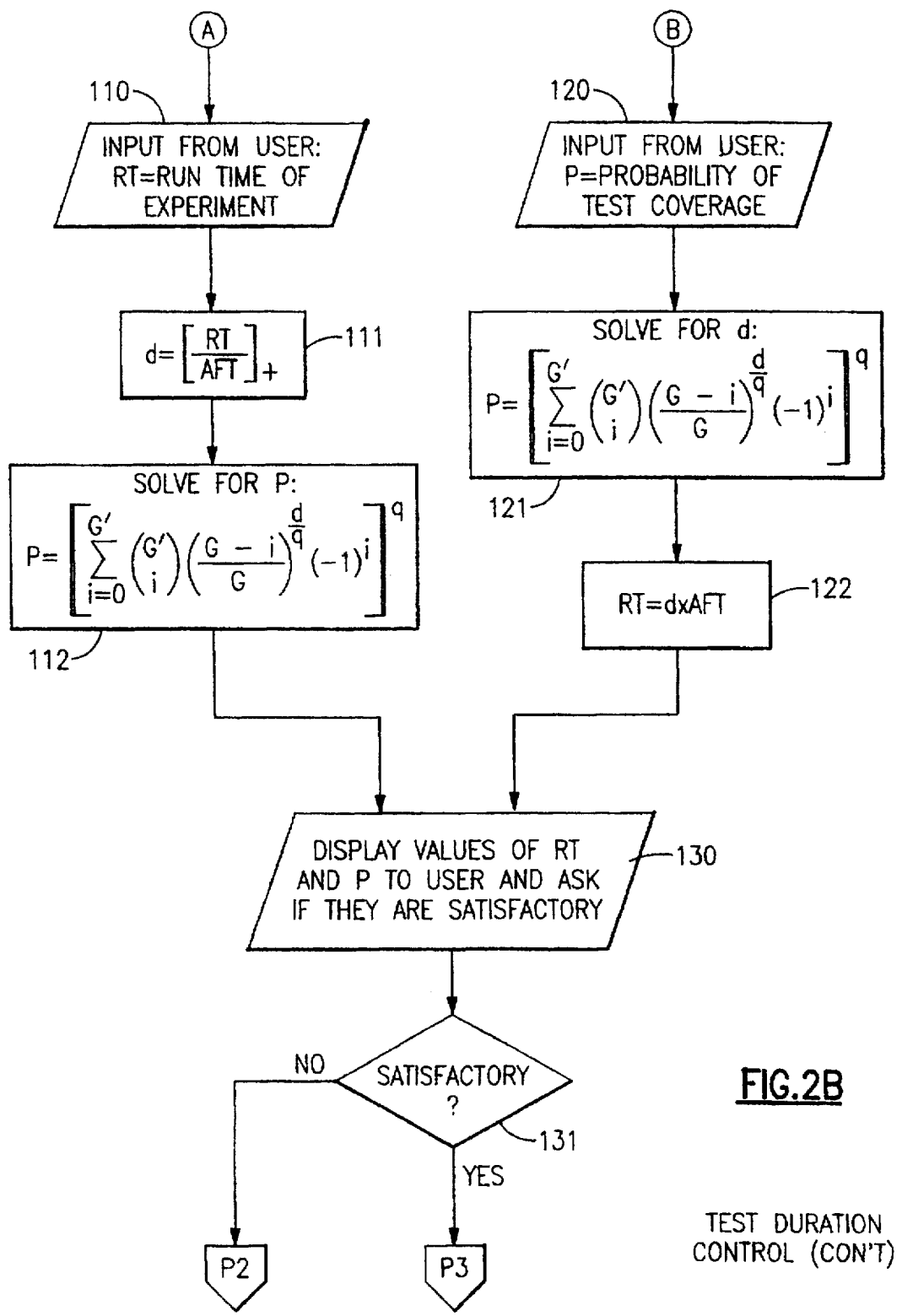

(Regarding FIGS. 1, 2A and 2C, these Figures represent Prior Art as described in U.S. Pat. No. 4,961,157, as shown by the legend in the FIGS. 1, 2A and 2C).

DETAILED DESCRIPTION OF THE INVENTION

Turning now to the invention in greater detail, our solution to reducing the time for testing now is to use the following formula for estimating the probability of complete test coverage when the interval (A,C) is used to determine the random timing between discharges:

$$P = \left[ \sum_{i=0}^{G} \binom{G}{i} \left( \frac{G-i}{G} \right)^{\frac{d}{q}} (-1)^i \right]^q \quad (A)$$

Where:

$$q = \frac{\text{program length}}{\text{ave. firing time}}$$

$$G = \frac{\text{program length}}{\text{element size} \times q}$$

and d is the total number of discharges.

In the case in which only a proportion A of the total number of elements need to be hit, the formula becomes:

$$P = \left[ \sum_{i=0}^{G} \binom{G}{i} \left( \frac{G-i}{G} \right)^{\frac{d}{q}} (-1)^i \right]^q \quad (B)$$

Where:

$$G = \frac{A \times \text{program length}}{\text{element size} \times q}$$

It is this equation (B) that we prefer to use in implementing our improved process as illustrated in FIG. 2B, in steps 112 and 121 where we solve for P and d respectively. These steps are an integral pad of the process described in the following preferred embodiment.

The Preferred Embodiment

The problem with the patented formulation of U.S. Pat. No. 4,961,157 we have now determined is that time is wasted during testing because the formula used to determine the amount of test time required was based on the interval (A,B) and not on the interval (A,C). As an example, the formula predicts that a 450 second program consisting of 90,000 elements would require 5 hour and 8 minute of testing using a zapper with an average firing rate of 15 ms in order to guarantee with 90% confidence that all elements would be hit. We have determined that the prior process, when replaced by the preferred embodiment with a process implementing the formula set forth above and detailed herein can be improved so that upon the same number of 90,000 elements tested, only four and one quarter (4¼) hours are required. This represents 21% less test time than was necessary when our prior work was implemented. With our now improved process, a reduction of 21% of the testing time in an actual manufacturing environment could result in the savings of millions of dollars each year.

FIG. 1 illustrates a preferred embodiment of the present invention in block diagram form as we did in the prior U.S. Pat. No. 4,961,157. In particular, it is seen that test controller 10 operates to control electrostatic discharge device 30 which supplies voltage stress pulses to a machine under test 40. Typically, the connection between discharge device 30 and machine 40 involves placement of a conductive lead from discharge device 30 in close proximity to machine 40. Actual physical contact is not essential for the practice of the invention.

Like our prior hardware implementation, the present invention discharge device 30 is controlled by means of test controller 10 which includes test duration controller 12 and random fire timing controller 14. Flow charts describing the operations of these two subcomponents of test controller 10 are illustrated in FIGS. 2A, 2B and 2C, illustrating where our improvement occurs in FIG. 2B at steps 112 and 121. In one embodiment of the present invention, test controller 10 still can be comprised of an IBM PC Personal Computer or another, current, Personal Computer. In our current embodiment this system's parallel port out is connected to a power supply so that signals from the PC control the discharge device 30.

User communication with test controller 10 was established via display 20 and keyboard 25. In particular, as indicated in the flowchart in FIG. 2A, test duration controller 12 requests the user to supply three parameters, namely the cycle time, CT, the length, PGM, of the repetitive test program 42 executing in machine 40, and the desired proportion, A, of the program to be covered. Two of these parameters may be specified in units of seconds. The third is preferably specified as a decimal number from 0.0 to 1.0 and indicates the proportion of program steps to be covered. The parameters, CT and PGM, are used to determine the number of steps N in diagnostic program 42. Thus it is seen that cycle time CT represents the execution time of the individual steps or subprocedures in program 42. It is an object of the present invention to insure with a specified level of confidence that a discharge from device 30 is provided to machine 40 during the execution of M of the N program steps. This is accomplished in a random, asynchronous fashion. Nevertheless, the randomness is controlled in terms of duration and firing time.

In the event that M=N (as for example when A=1.0), each program step is specified. However, when A<1.0, fewer than all N steps are targeted. The choice of a value for A less than 1.0 is particularly useful when program 42 includes a step which is a long initialization routine for which hardware testing is less critical or even unnecessary.

In operation, the user, in response to queries generated by test duration controller 12 supplies cycle time, proportion and test program length information. Test duration controller 12 also further inquires whether the user wishes to specify either an experiment which is limited by a specific run-time or the achievement of a certain probability of producing a discharge during each of the steps in program 42. If the user specifies that the experiment is to be run-time limited, it is a feature of the preferred of the present invention that the user is provided with an indication of the probability P of achieving the desired complete discharge coverage. However, for experiments which are limited by user specified run-time, or RT, it is not essential for proper operation of the invention to determine the value P, although it is still desirable.

However, it is also possible for the user to specify a certain probability of complete discharge coverage for each of the N program steps (or M program steps that are to be covered). In this case, it is necessary to determine the number of random discharges which should be produced to achieve the specified probability, P. It has been shown by the applicants' in the prior U.S. Pat. No. 4,961,157 that the relation between the probability P and the number of discharge iterations d which are required to achieve the specified success level is specified as:

$$P = \sum_{i=0}^{N} \binom{N}{i} \left( \frac{N-i}{N} \right)^d (-1)^i. \tag{1}$$

Also, as shown by our patent, if the user specifies a proportion, A, not equal to 1, then the probability P is computed as follows:

$$P = \sum_{i=0}^{M} \binom{M}{i} \left( \frac{N-i}{N} \right)^d (-1)^i. \tag{2}$$

where M is computed as the smallest integer greater than A×N. Notationally M is written as [A×N] sub+as seen in FIG. 2A.

It is noted that in the case in which the user specifies the run time of the experiment, the value of d is readily computed in accordance with our process (see FIG. 2B and below with respect to option "A" from step 105). Furthermore, in this case, once given values for d and N the value for P is readily computed in accordance with Equations (1) or (2) above but as modified in accordance with our improvements set forth above as illustrated in FIG. 2B., step 112 where the preferred formula (B) above is solved for P. However, in the event that the user specifies a probability of complete discharge coverage, then Equations (1) or (2) above must be solved for d as a function of the specified probability, P, as modified in accordance with our improvements set forth above as illustrated in FIG. 2B., step 121 where the preferred formula (B) above is solved for d. From a numerical analysis point of view this is a much more difficult problem though still solvable by several different means. For example, since the value of d is integer, only a finite number of possibilities need to be investigated. Furthermore, tables can be pre-computed based upon values of N and d with table entries indicating the resultant probabilities P.

Attention is now specifically directed to the flowcharts illustrated in FIGS. 2A through 2C. As indicated above, test duration controller 12 requests input information from the user in step 100: In particular, in FIG. 2A, the user is prompted to supply cycle time, CT, test program length, PGM and proportion A. Next, controller 12 computes a value for N in step 101 by dividing PGM by CT and rounding up to the next integer value. In particular, in steps 101 and 111 (discussed below) the square brackets having a subscripted "+" sign denote "the smallest integer greater than OR EQUAL TO" the value. A value for M is also computed in step 101 as [A×N], where A is the user specified proportion. Next, in step 102, controller 12 specifies L, the minimum firing time. This parameter is dependent on the specifications of the electrostatic discharge unit itself and is related to specific hardware and is therefore preset. However, under test conditions, L was set to approximately 8 milliseconds in tests carried out by the applicants. Typically, L most strongly depends on firing relay characteristics such as pick time and release time. Furthermore, inherent randomness found in relay operation actually contributes in a positive way to overall randomness in firing times. Although this relay characteristic is not essential to the operation of the present invention, it is more than acceptable as long as relay operation is not significantly delayed.

Next, controller 12 computes an average firing time interval duration, AFT, as L+MIN(PGM,L)/2 in step 103 as shown. Next, in step 104 controller 12 inquires of the users whether they wish to specify either a run time for the experiment or a probability of test coverage as a parameter for controlling test duration. In step 105, controller 12 analyzes the users' response which is preferably provided through display 20 and keyboard 25.

In the event that the user specifies a run time parameter for duration control (option "A"), controller 12 requests a run time value, RT, as shown in step 110 (the reader being cautioned not to confuse proportion variable A with option "A", these being different concepts). Next, in step 111 a value for duration d, in terms of the number of iterations, is computed as the smallest integer greater than the ratio of RT to AFT. Next, having been able to compute values for N, M and d, controller 12 preferably computes probability P as specified by Equations (A) or (B) above and in step 112 in accordance with our improvements as illustrated in FIG. 2B step 112.

Then in step 130 controller 12 preferably displays values of RT and P to the user and further inquires as to whether or not these values are satisfactory. In particular, in the case at hand, if the run time of the experiment produces a probability P which is unsatisfactory to the user, then the user, in step 131, is given the opportunity to indicate an unsatisfactory result in which case control returns to step 104 and the cycle is repeated as necessary. It is in step 112, that no special consideration must be given to solving for P having been given values for N, M and d.

If, in step 104, the user has specified that the duration is to be controlled by a probability parameter, then, in step 120 (FIG. 2B), the user is requested to supply a desired probability of discharge coverage. Based upon the confidence level or probability P supplied by the user, controller 12 computes, in step 121, an appropriate value for d in accordance with the equation specified therein and elaborated above in accordance with our improvements as illustrated in FIG. 2B step 121 where the formula (B) above is employed. As indicated above, the value of d may be determined from iterative numerical computations, from tables or from any one of several approximation formulas indicated above. Based upon the value of d determined, a run time computation is carried out in step 122 in which RT is computed as the product of d and AFT. As above, in step 130, the values of RT and P are preferably displayed to the user together with an inquiry as to whether or not these values are satisfactory. In particular, it may appear to the user that the probability of test coverage specified could result in a test duration which is too long for practicability or conversely, the user may be provided with an indication that the run time is relatively short so that increased confidence levels can be specified for tests which can be carried out in a reasonable amount of time.

It is thus seen that test duration controller 12, in response to user input parameters A, CT and PGM and a choice of termination procedure, determines a value for d, a measure of test duration. It is the determination of a value for d which is the primary function of duration controller 12. In the event that the user specifies a probability P, it is necessary for controller 12 to determine an appropriate value for d in which case the controller returns to the user a specified run time, RT. In the converse situation in which an experiment run time is supplied by the user, controller 12 readily computes a value for d (in step 111) and, essentially for convenience, supplies to the user a value of P.

Once the user has specified, in step 131, that the run time and/or confidence level, is satisfactory, control is passed to random fire timing controller 14. This function is implementable as indicated in the flow chart in FIG. 2C. In particular, in order to control the number of firings or discharges that occur, a counter is initialized to the value 1 in step 140. Next, in step 141, a random number between 0 and the lower of PGM and L is generated. This random number is preferably selected from a uniform distribution between these two limits. This random number may be generated by any one of a number of conventional computer routines for random number generation. Next, as indicated in step 142, fire timing controller 14 waits for a period of L+R seconds after which a signal is sent to electrostatic discharge device 30 to initiate firing. The firing signal may for example be supplied through interface card 16, more particularly described above. Next, timing controller 14 determines whether or not counter 1, initialized in step 140, is equal to d. If it is, the user is informed (in step 145) that the experiment is completed. If equality is not present between counter 1 and duration d (step 143), the counter is incremented by 1 (in step 144) after which control is returned to step 141 which again generates a random number between 0 and min(PGM, L).

Thus in spite of the fact that electrostatic discharge device 30 is now operated randomly, it is nonetheless seen that more complete coverage of the program steps in program 42 is achieved.

From the above, it should be appreciated that the present invention provides significant advantages over noise injection devices or zappers previously used, particularly with respect to electrostatic stress testing of complicated digital computing machinery. More particularly, it is seen that the present invention provides the user with greater flexibility in terms of test duration and specifiable confidence levels. It is further seen, that while the present invention is particularly applicable to the testing of computing machinery, the discharge tester of the present invention is also applicable to other electronic machinery. It is further seen that the present invention has the advantage of being interactive with the user and provides the user with information which is not supplied by other commercially available discharge devices. Furthermore, it is seen that the approach developed by the present applicants of providing a random zapping functionality is superior in theory and in practice to deterministic zapping apparatus and methods.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. An apparatus for conducting an electrostatic discharge test of a machine which repetitively executes a stored program having a plurality of program steps, said apparatus comprising:

electrostatic discharge means for supplying electrostatic discharges to said machine;

random fire timing control means for controlling time intervals between said electrostatic discharges such that said time intervals are random;

test duration control means for controlling the duration of said electrostatic discharge test, wherein said test duration control means for controlling the duration of said electrostatic discharge test employs a controller of said machine to execute a program step to computes an average firing time interval duration, AFT, and, in program step, said controller inquires of the users whether they wish to specify either a run time RT for the experiment or a probability of test coverage as a parameter for controlling test duration, and in the event that the user specifies a run time parameter for duration control said controller of said machine requests a run time value, RT, and subsequently computes a duration value d, in terms of the number of iterations, which is as the smallest integer greater than or equal to the ratio of RT to AFT, and subsequently, using computed values for variables for $$P = \left[ \sum_{i=0}^{G} \binom{G}{i} \left( \frac{G-i}{G} \right)^{-\frac{d}{q}} (-1)^i \right]^q \quad (B)$$

(Where:

$$G = \frac{A \times \text{program length}}{\text{element size} \times q}$$

and A is the value of proportion A of the total number of elements needed to be hit and where:

$$q = \frac{\text{program length}}{\text{ave. firing time}}$$

computes the probability P, and displays the values of RT and P to the user to determine if they are satisfactory.

2. The apparatus of claim 1 in program step, when said controller inquires of the users whether they wish to specify either a run time for the experiment or a probability of test coverage as a parameter for controlling test duration, and in the event that the user specifies a probability of test coverage parameter for duration control, said controller of said machine a probability value solving $$P = \left[ \sum_{i=0}^{G} \binom{G}{i} \left( \frac{G-i}{G} \right)^{-\frac{d}{q}} (-1)^i \right]^q \quad (B)$$

(Where:

$$G = \frac{A \times \text{program length}}{\text{element size} \times q}$$

and A is the value of proportion A of the total number of elements needed to be hit)

for d, and computes RT=d*AFT to obtain the value RT and displays the values of RT and P to the user to determine if they are satisfactory.

3. The apparatus of claim 2 in which a user specified run time limit is interactively specifiable.

4. The apparatus of claim 1 in which a user may specify, when it is desired to hit all elements, that the probablity of complete test coverage is estimated when the interval (A,C) is used to determine the random timing between discharges in accordance with the following formula:

$$P = \left[ \sum_{i=0}^{G} \binom{G}{i} \left( \frac{G-i}{G} \right)^{-\frac{d}{q}} (-1)^i \right]^q \quad (A)$$

Where:

$$q = \frac{\text{program length}}{\text{ave. firing time}}$$

$$G = \frac{\text{program length}}{\text{element size} \times q}$$

and d is the total number of discharges.

5. A method for conducting an electrostatic discharge test of a machine which is repetitively executing a stored program having a plurality of program steps, said method comprising the step of:

electrostatically exciting said machine at randomly spaced time intervals and for a duration determined through user specified parameters selected from the group consisting of run time duration and confidence level, said confidence level being specified as the probability of at least one discharge occurring during a proportion of said program steps, wherein the method includes a step of requesting from said user a parameter selected from the group consisting of the run time duration in response to the user specified confidence level in response to said user specified duration as a parameter for controlling test duration, and in the event that the user specifies a run time parameter for duration control a controller of said machine requests a run time value, RT, and subsequently computes a duration value d, in terms of the number of iterations, which is as the smallest integer greater than or equal to the ratio of RT to AFT, and subsequently, using computed values for variables for $$P = \left[ \sum_{i=0}^{G} \binom{G}{i} \left( \frac{G-i}{G} \right)^{-\frac{d}{q}} (-1)^i \right]^q \quad (B)$$

(Where:

$$G = \frac{A \times \text{program length}}{\text{element size} \times q}$$

and A is the value of proportion A of the total number of elements needed to be hit and where:

$$q = \frac{\text{program length}}{\text{ave. firing time}}$$

computes the probability P, and displays the values of RT and P to the user to determine if they are satisfactory.

6. The method of claim 5 wherein, in a program step, when said controller inquires of the users whether they wish to specify either a run time for the experiment or a probability of test coverage as a parameter for controlling test duration, and in the event that the user specifies a probability of test coverage parameter for duration control, said controller of said machine a probability value solving $$P = \left[ \sum_{i=0}^{G} \binom{G}{i} \left( \frac{G-i}{G} \right)^{\frac{d}{q}} (-1)^i \right]^q \quad \text{(B)}$$

(Where:

$$G = \frac{A \times \text{program length}}{\text{element size} \times q}$$

and A is the value of proportion A of the total number of elements needed to be hit)

for d, and computes RT=d*AFT to obtain the value RT and displays the values of RT and P to the user to determine if they are satisfactory.

7. The apparatus of claim 6 in which a user specified time limit is interactively specifiable.

8. The method of claim 6 in which said user specification of parameters is interactive.

9. The method of claim 5 in which a user may specify, when it is desired to hit all elements, that the probability of complete test coverage is estimated when the interval (A,C) is used to determine the random timing between discharges in accordance with the following formula:

$$P = \left[ \sum_{i=0}^{G} \binom{G}{i} \left( \frac{G-i}{G} \right)^{\frac{d}{q}} (-1)^i \right]^q \quad \text{(A)}$$

Where:

$$q = \frac{\text{program length}}{\text{ave. firing time}}$$

$$G = \frac{\text{program length}}{\text{element size} \times q}$$

and d is the total number of discharges.

* * * * *

UNITED STATES PATENT AND TRADEMARK OFFICE
CERTIFICATE OF CORRECTION

Page 1 of 2

PATENT NO. : 5,684,726

DATED : November 4, 1997

INVENTOR(S) : Brock Estel Osborn et al.

It is certified that error appears in the above-identified patent and that said Letters Patent is hereby corrected as shown below:

Incorrect FIG.2B printed (See Amendment) FIG.2B is not prior art.
 In the drawings :
 Figure 2B should be deleted to appear as per attached sheet.

Signed and Sealed this

Twentieth Day of July, 1999

*Attest:*

Q. TODD DICKINSON

*Attesting Officer*  Acting Commissioner of Patents and Trademarks

TEST DURATION CONTROL (CON'T)